United States Patent
Clemens et al.

(10) Patent No.: US 7,442,954 B2
(45) Date of Patent: Oct. 28, 2008

(54) ORGANIC ELECTRONIC COMPONENT COMPRISING A PATTERNED, SEMI-CONDUCTING FUNCTIONAL LAYER AND A METHOD FOR PRODUCING SAID COMPONENT

(75) Inventors: Wolfgang Clemens, Puschendorf (DE); Walter Fix, Nuremberg (DE); Andreas Ullmann, Zirndorf (DE)

(73) Assignee: PolyIC GmbH & Co. KG, Furth (DE)

( * ) Notice: Subject to any disclaimer, the term of this patent is extended or adjusted under 35 U.S.C. 154(b) by 452 days.

(21) Appl. No.: 10/535,448

(22) PCT Filed: Nov. 13, 2003

(86) PCT No.: PCT/DE03/03770

§ 371 (c)(1), (2), (4) Date: Sep. 19, 2005

(87) PCT Pub. No.: WO2004/047144

PCT Pub. Date: Jun. 3, 2004

(65) Prior Publication Data

US 2006/0118779 A1    Jun. 8, 2006

(30) Foreign Application Priority Data

Nov. 19, 2002  (DE) .............................. 102 53 953

(51) Int. Cl.
*H01L 29/08* (2006.01)
*H01L 35/24* (2006.01)
*H01L 51/00* (2006.01)

(52) U.S. Cl. .................. 257/40; 257/E21.051; 438/99; 438/149; 438/164

(58) Field of Classification Search ................. 257/40, 257/E21.051; 438/99, 149, 164
See application file for complete search history.

(56) References Cited

U.S. PATENT DOCUMENTS

| 3,512,052 A | 5/1970 | MacIver et al. |
| 3,769,096 A | 10/1973 | Ashkin |

(Continued)

FOREIGN PATENT DOCUMENTS

DE    33 38 597    5/1985

(Continued)

OTHER PUBLICATIONS

U.S. Appl. No. 10/562,989, filed Jun. 29, 2006, Jurgen Ficker et al.

(Continued)

*Primary Examiner*—Asok K Sarkar
(74) *Attorney, Agent, or Firm*—Carella, Byrne et al.; Elliot M. Olstein; William Squire

(57) ABSTRACT

The invention relates to an organic electronic component such as an organic field effect transistor and a method for producing said component, the semiconducting layer of the component being patterned, although the component can be produced by an inexpensive printing method. In order to achieve this, the lower functional layer is prepared by a treatment such that it has partial regions on which wetting takes place in the subsequent process step, and partial regions on which wetting is not effected.

12 Claims, 1 Drawing Sheet

U.S. PATENT DOCUMENTS

Figure 1:
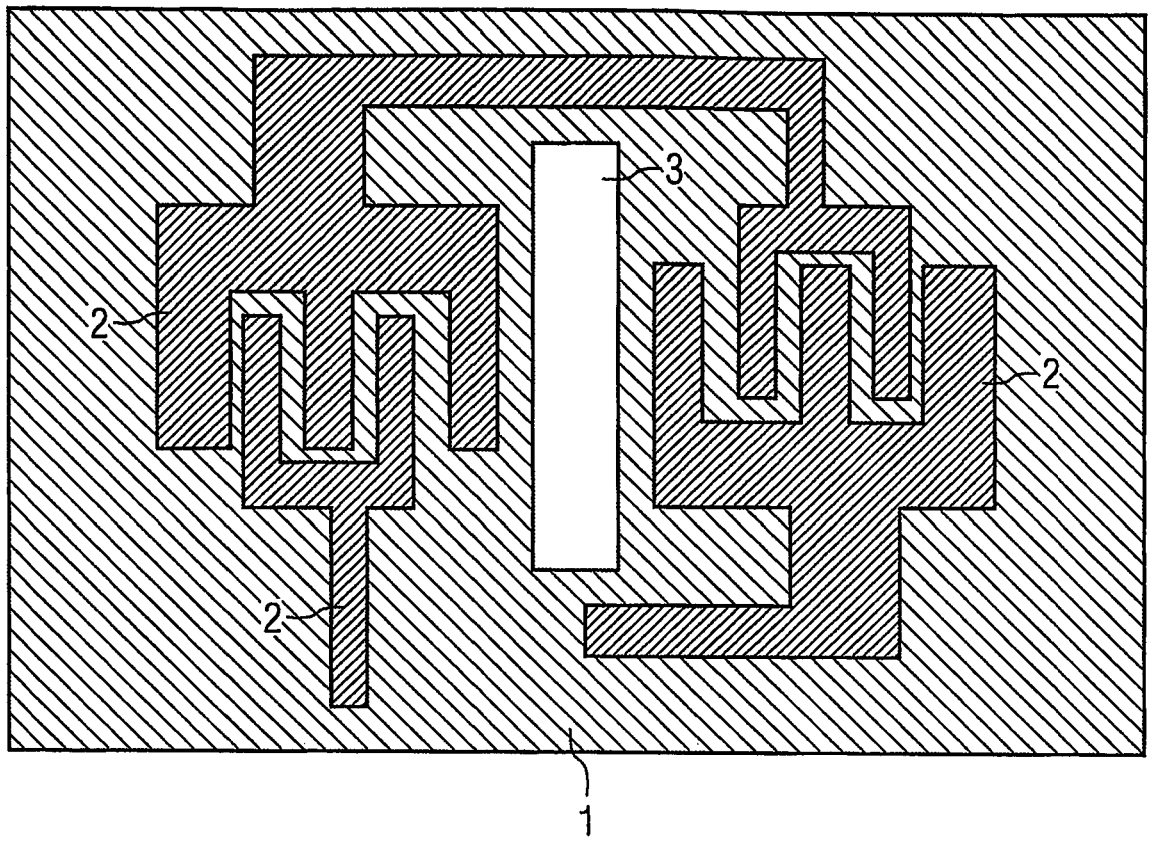

| | | | |
|---|---|---|---|
| 3,955,098 A | 5/1976 | Kawamoto |
| 4,302,648 A | 11/1981 | Sado et al. |
| 4,442,019 A | 4/1984 | Marks |
| 4,865,197 A | 9/1989 | Craig |
| 4,926,052 A | 5/1990 | Hatayama et al. |
| 5,173,835 A | 12/1992 | Cornett et al. |
| 5,206,525 A | 4/1993 | Yamamoto et al. |
| 5,259,926 A | 11/1993 | Kuwabara et al. |
| 5,321,240 A | 6/1994 | Takihira |
| 5,347,144 A | 9/1994 | Garnier et al. |
| 5,395,504 A | 3/1995 | Saurer et al. |
| 5,480,839 A | 1/1996 | Ezawa et al. |
| 5,486,851 A | 1/1996 | Gehner et al. |
| 5,502,396 A | 3/1996 | Desarzens et al. |
| 5,546,889 A | 8/1996 | Wakita et al. |
| 5,569,879 A | 10/1996 | Gloton et al. |
| 5,574,291 A | 11/1996 | Dodabalapur et al. |
| 5,578,513 A | 11/1996 | Maegawa |
| 5,580,794 A | 12/1996 | Allen |
| 5,629,530 A | 5/1997 | Brown et al. |
| 5,630,986 A | 5/1997 | Charlton et al. |
| 5,652,645 A | 7/1997 | Jain |
| 5,691,089 A | 11/1997 | Smayling |
| 5,729,428 A | 3/1998 | Sakata et al. |
| 5,854,139 A | 12/1998 | Kondo et al. |
| 5,869,972 A | 2/1999 | Birch et al. |
| 5,892,244 A | 4/1999 | Tanaka et al. |
| 5,946,551 A | 8/1999 | Dimitrakopoulos |
| 5,967,048 A | 10/1999 | Fromson et al. |
| 5,970,318 A | 10/1999 | Choi et al. |
| 5,973,598 A | 10/1999 | Beigel |
| 5,997,817 A | 12/1999 | Crismore et al. |
| 6,036,919 A | 3/2000 | Thym et al. |
| 6,045,977 A | 4/2000 | Chandross et al. |
| 6,060,338 A | 5/2000 | Tanaka et al. |
| 6,083,104 A | 7/2000 | Choi |
| 6,087,196 A | 7/2000 | Sutrm et al. |
| 6,133,835 A | 10/2000 | DeLeeuw et al. |
| 6,207,472 B1 | 3/2001 | Calligari et al. |
| 6,215,130 B1 | 4/2001 | Dodabalapur |
| 6,251,513 B1 | 6/2001 | Rector et al. |
| 6,284,562 B1 | 9/2001 | Batlogg et al. |
| 6,300,141 B1 | 10/2001 | Segal et al. |
| 6,321,571 B1 | 11/2001 | Themont et al. |
| 6,322,736 B1 | 11/2001 | Bao |
| 6,335,539 B1 | 1/2002 | Dimitrakopoulos et al. |
| 6,340,822 B1 | 1/2002 | Brown et al. |
| 6,344,662 B1 | 2/2002 | Dimitrakopoulos et al. |
| 6,403,396 B1 | 6/2002 | Gudesen et al. |
| 6,429,450 B1 | 8/2002 | Mutsaers et al. |
| 6,517,955 B1 | 2/2005 | Jacobsen et al. |
| 6,852,583 B2 | 2/2005 | Bernds et al. |
| 6,903,958 B2 | 6/2005 | Bernds et al. |
| 2002/0018911 A1 | 2/2002 | Bemius et al. |
| 2002/0022284 A1 | 2/2002 | Heeger |
| 2002/0025391 A1 | 2/2002 | Angelopoulos |
| 2002/0053320 A1 | 5/2002 | Duthaler |
| 2002/0056839 A1 | 5/2002 | Joo et al. |
| 2002/0068392 A1 | 6/2002 | Lee et al. |
| 2002/0130042 A1 | 9/2002 | Moerman et al. |
| 2002/0170897 A1 | 11/2002 | Hall |
| 2002/0195644 A1 | 12/2002 | Dodabalapur et al. |
| 2003/0059987 A1 | 3/2003 | Sirringhaus et al. |
| 2003/0112576 A1 | 6/2003 | Brewer et al. |
| 2004/0002176 A1 | 1/2004 | Xu |
| 2004/0013982 A1 | 1/2004 | Jacobson et al. |
| 2004/0026689 A1 | 2/2004 | Bernds et al. |
| 2004/0075093 A1 * | 4/2004 | Arai et al. ............ 257/66 |
| 2004/0084670 A1 | 5/2004 | Tripsas et al. |
| 2004/0211329 A1 | 10/2004 | Funahata et al. |

FOREIGN PATENT DOCUMENTS

| | | |
|---|---|---|
| DE | 42 43 832 | 6/1994 |
| DE | 198 52 312 | 5/1999 |
| DE | 198 16 860 | 11/1999 |
| DE | 199 18 193 | 11/1999 |
| DE | 100 06 257 | 9/2000 |
| DE | 199 21 024 | 11/2000 |
| DE | 199 33 757 | 1/2001 |
| DE | 695 19 782 | 1/2001 |
| DE | 199 35 527 | 2/2001 |
| DE | 199 37 262 | 3/2001 |
| DE | 100 12 204 | 9/2001 |
| DE | 100 33 112 | 1/2002 |
| DE | 100 43 204 | 4/2002 |
| DE | 100 45 192 | 4/2002 |
| DE | 100 47 171 | 4/2002 |
| DE | 100 58 559 | 5/2002 |
| DE | 100 61 297 | 6/2002 |
| DE | 101 17 663 | 10/2002 |
| DE | 101 20 687 | 10/2002 |
| DE | 102 19 905 | 12/2003 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 442 123 | 8/1991 |
| EP | 0 460 242 | 12/1991 |
| EP | 0 501 456 A2 | 9/1992 |
| EP | 0 501 456 A3 | 9/1992 |
| EP | 0 511 807 | 11/1992 |
| EP | 0 528 662 | 2/1993 |
| EP | 0 685 985 | 12/1995 |
| EP | 0 716 458 | 6/1996 |
| EP | 0 785 578 A2 | 7/1997 |
| EP | 0 785 578 A3 | 7/1997 |
| EP | 0 615 256 | 9/1998 |
| EP | 0 962 984 | 12/1999 |
| EP | 0 966 182 | 12/1999 |
| EP | 0 979 715 | 2/2000 |
| EP | 0 981 165 | 2/2000 |
| EP | 0 989 614 A2 | 3/2000 |
| EP | 1 048 912 | 11/2000 |
| EP | 1 052 594 | 11/2000 |
| EP | 1 065 725 A2 | 1/2001 |
| EP | 1 065 725 A3 | 1/2001 |
| EP | 1 083 775 | 3/2001 |
| EP | 1 102 335 A2 | 5/2001 |
| EP | 1 103 916 | 5/2001 |
| EP | 1 104 035 A2 | 5/2001 |
| EP | 1 134 694 | 9/2001 |
| EP | 1 224 998 | 7/2002 |
| EP | 1 237 207 | 9/2002 |
| EP | 1 318 084 | 6/2003 |
| FR | 2793089 | 11/2000 |
| GB | 723598 | 2/1955 |
| GB | 2 058 462 | 4/1981 |
| JP | 54069392 | 6/1979 |
| JP | 60117769 | 6/1985 |
| JP | 61001060 | 1/1986 |
| JP | 61167854 | 7/1986 |
| JP | 362065477 A | 3/1987 |
| JP | 01169942 | 7/1989 |
| JP | 05152560 | 6/1993 |
| JP | 05259434 | 10/1993 |
| JP | 05347422 | 12/1993 |
| JP | 08197788 | 8/1995 |
| JP | 09083040 | 3/1997 |
| JP | 09320760 | 12/1997 |
| JP | 10026934 | 1/1998 |
| JP | 2969184 B | 11/1999 |

| | | |
|---|---|---|
| JP | 2001085272 | 3/2001 |
| WO | WO 93/16491 | 8/1993 |
| WO | WO 94/17556 | 8/1994 |
| WO | WO 95/06240 | 3/1995 |
| WO | WO 95/31831 | 11/1995 |
| WO | WO 96/02924 | 2/1996 |
| WO | WO 96/19792 | 6/1996 |
| WO | WO 97/12349 | 4/1997 |
| WO | WO 97/18944 | 5/1997 |
| WO | WO 98/18156 | 4/1998 |
| WO | WO 98/18186 | 4/1998 |
| WO | WO 98/40930 | 9/1998 |
| WO | WO 99/07189 | 2/1999 |
| WO | WO 99/10929 | 3/1999 |
| WO | WO 99/10939 | 3/1999 |
| WO | WO 99/21233 | 4/1999 |
| WO | WO 99/40631 | 8/1999 |
| WO | WO 99/53371 | 10/1999 |
| WO | WO 99/54936 | 10/1999 |
| WO | WO 99/66540 | 12/1999 |
| WO | WO 00/33063 | 6/2000 |
| WO | WO 00/36666 | 6/2000 |
| WO | WO 00/79617 | 12/2000 |
| WO | WO 01/03126 | 1/2001 |
| WO | WO 01/06442 | 1/2001 |
| WO | WO 01/08241 | 2/2001 |
| WO | WO 01/15233 | 3/2001 |
| WO | WO 01/17029 | 3/2001 |
| WO | WO 01/17041 | 3/2001 |
| WO | WO 01/27998 | 4/2001 |
| WO | WO 01/46987 | 6/2001 |
| WO | WO 01/47044 A2 | 6/2001 |
| WO | WO 01/47044 A3 | 6/2001 |
| WO | WO 01/47045 | 6/2001 |
| WO | WO 01/73109 A2 | 10/2001 |
| WO | WO 01/73109 A3 | 10/2001 |
| WO | WO 02/05360 | 1/2002 |
| WO | WO 02/05361 | 1/2002 |
| WO | WO 02/15264 | 2/2002 |
| WO | WO 02/19443 | 3/2002 |
| WO | WO 02/29912 | 4/2002 |
| WO | WO 02/43071 | 5/2002 |
| WO | WO 02/47183 | 6/2002 |
| WO | WO 02/065557 A1 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02/095805 A2 | 11/2002 |
| WO | WO 02/095805 A3 | 11/2002 |
| WO | WO 02/099907 | 12/2002 |
| WO | WO 02/099908 | 12/2002 |
| WO | WO 03/046922 | 6/2003 |
| WO | WO 03/067680 | 8/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 2004/042837 A2 | 5/2004 |
| WO | WO 2004/042837 A3 | 5/2004 |
| WO | WO 2004/007194 A2 | 6/2004 |
| WO | WO 2004/007194 A3 | 6/2004 |
| WO | WO 2004/047144 A2 | 6/2004 |
| WO | WO 2004/047144 A3 | 6/2004 |
| WO | WO 2004/083859 | 9/2004 |

OTHER PUBLICATIONS

U.S. Appl. No. 10/52,869, filed Oct. 5, 2006, Walter Fix et al.
U.S. Appl. No. 10/569,763, Walter Fix et al.
U.S. Appl. No. 10/568,730, filed Feb. 8, 2007, Wolfgang Clemens et al.
U.S. Appl. No. 10/569,233, filed Jan. 25, 2007, Adolf Bernds et al.
U.S. Appl. No. 10/570,571, filed Jan. 11, 2017, Wolfgang Clemens et al.
U.S. Appl. No. 10/585,775, Walter Fix.
U.S. Appl. No. 11/574,139, Jurgen Ficker.
U.S. Appl. No. 10/332,140, Method for the Production and Configuration of Organic Field-Effect Transistors (OFET), Adolf Bernds et al.
U.S. Appl. No. 10/344,951, Organic Field-Effect Transistor (OFET), A Production Method Therefor, An Integrated Circuit Constructed From the Same and Their Uses, Adolf Bernds et al.
U.S. Appl. No. 10/362,932, Organic Field Effect Transistor, Method for Structuring an OFET and Integrated Circuit, Adolf Bernds et al.
U.S. Appl. No. 10/380,113, Organic Rectifier, Circuit, RFID Tag and Use of an Organic Rectifier, Adolf Bernds et al.
U.S. Appl. No. 10/380,206, Organic Memory, Identification Marker (RFID-TAG) with Organic Memory and Uses of an Organic Memory, Adolf Bernds et al.
U.S. Appl. No. 10/381,032, Electrode and/or Conductor Track for Organic Components and Production Method Thereof, Adolf Bernds et al.
U.S. Appl. No. 10/433,959, Organic Field Effect Transistor, Method For Structuring an OFET and Integrated Circuit, Adolf Bernds.
U.S. Appl. No. 10/433,961, Device For Detecting and/or Transmitting at Least One Environmental Influence, Method for Producing Said Device and Use Thereof, Wolfgang Clemens et al.
U.S. Appl. No. 10/467,636, Organic Field Effect Transistor With a Photostructured Gate Dielectric, Method for the Production and Use Thereof in Organic Electronics, Adolf Bernds et al.
U.S. Appl. No. 10/473,050, Device With At Least Two Organic Electronic Components and Method for Producing the Same, Adolf Bernds et al.
U.S. Appl. No. 10/479,234, Organic Field Effect Transistor, Method for Production and Use Thereof in the Assembly of Integrated Circuits, Adolf Bernds et al.
U.S. Appl. No. 10/479,238, Method For Producing Conductive Structures by Means of Printing Technique, and Active Components Produced Therefrom For Integrated Circuits, Adolf Bernds et al.
U.S. Appl. No. 10/492,922, Insulator for An Organic Electronic Component, Erwann Guillet et al.
U.S. Appl. No. 10/492,923, Electronic Unit, Circuit Design for the Same and Production Method, Wolfgang Clemens et al.
U.S. Appl. No. 10/498,610, Organic Field Effect Transistor with Offset Threshold Voltage and the Use Thereof, Walter Fix et al.
U.S. Appl. No. 10/508,640, Logic Component Comprising Organic Field Effect Transistors, Walter Fix et al.
U.S. Appl. No. 10/508,737, Device and Method for Laser Structuring Functional Polymers and, Adolf Bernds et al.
U.S. Appl. No. 10/517,750, Substrate for an Organic Field Effect Transistor, Use of the Substrate, Method of Increasing the Charge Carrier Mobility and Organic Field Effect Transistor (OFET), Wolfgang Clemens et al.
U.S. Appl. No. 10/523,216, Electronic Component Comprising Predominantly Organic Functional Materials And A Process For The Production Thereof, Adolf Bernds et al.
U.S. Appl. No. 10/523,487, Electronic Device, Wolfgang Clemens et al.
U.S. Appl. No. 10/524,646, Organic Component for Overvoltage Protection and Associated Circuit, Walter Fix et al.
U.S. Appl. No. 10/533,756, Organic Electronic Component with High-Resolution Structuring and Process for the Production Thereof, Wolfgang Clemens et al.
U.S. Appl. No. 10/534,678, Measuring Apparatus for Determining an Analyte in a Liquid Sample, Wolfgang Clemens et al.
U.S. Appl. No. 10/535,448, Organic Electronic Component Comprising Semi-Conductive Functional Layer and Method for Producing Said Component, Wolfgang Clemens et al.
U.S. Appl. No. 10/535,449, Organic Electronic Component Comprising the Same Organic Material for at Least Two Functional Layers, Adolf Bernds et al.
U.S. Appl. No. 10/344,926, An Electronic Circuit Having an Encapsulated Organic-Electronic Component, and a Method for Making an Encapsulated Organic-Electronic Component, Wolfgang Clemens et al.

U.S. Appl. No. 10/541,815, Organo-Resistive Memory Unit, Axel Gerit et al.
U.S. Appl. No. 10/541,956, Board or Substrate for an Organic Electronic Device and Use Thereof, Wolfgang Clemens et al.
U.S. Appl. No. 10/541,957, Organic Field Effect Transistor And Integrated Circuit, Walter Fix et al.
U.S. Appl. No. 10/543,561, Organic Storage Component and Corresponding Triggering Circuit, Wolfgang Clemens et al.
U.S. Appl. No. 10/542,678, Organic Electronic Component and Method For Producing Organic Electronic Devices, Adolf Bernds et al.
U.S. Appl. No. 10/542,679, Use of Conductive Carbon Black/Graphite Mixtures for the Production of Low-Cost Electronics, Adolf Bernds et al.
U.S. Appl. No. 10/344,926, filed Feb. 12, 2004, Adolf Bernds et al.
U.S. Appl. No. 10/344,951, filed Feb. 12, 2004, Adolf Bernds et al.
U.S. Appl. No. 10/362,932, filed Oct. 2, 2004, Adolf Bernds et al.
U.S. Appl. No. 10/380,113, filed Sep. 25, 2003, Adolf Bernds et al.
U.S. Appl. No. 10/381,032, filed Feb. 12, 2004, Adolf Bernds et al.
U.S. Appl. No. 10/433,959, filed Apr. 1, 2004, Adolf Bernds.
U.S. Appl. No. 10/433,961, filed Apr. 1, 2004, Wolfgang Clemens et al.
U.S. Appl. No. 10/451,108, filed May 13, 2004, Mark Giles et al.
U.S. Appl. No. 10/467,636, filed Nov. 4, 2004, Adolf Bernds et al.
U.S. Appl. No. 10/473,050, filed May 20, 2004, Adolf Bernds et al.
U.S. Appl. No. 10/479,234, filed Dec. 30, 2004, Adolf Bernds et al.
U.S. Appl. No. 10/479,238, filed Oct. 20, 2004, Adolf Bernds et al.
U.S. Appl. No. 10/492,922, filed Mar. 3, 2005, Erwann Buillet et al.
U.S. Appl. No. 10/492,923, filed Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, Adolf Bernds et al.
U.S. Appl. No. 10/517,750, Wolfgang Clemens et al.
U.S. Appl. No. 10/523,216, Adolf Bernds et al.
U.S. Appl. No. 10/523,487, Wolfgang Clemens et al.
U.S. Appl. No. 10/524,646, Walter Fix et al.
U.S. Appl. No. 10/533,756, Wolfgang Clemens et al.
U.S. Appl. No. 10/534,678, Wolfgang Clemens et al.
U.S. Appl. No. 10/535,448, W. Clemens et al.
U.S. Appl. No. 10/535,449, Walter Fix et al.
U.S. Appl. No. 10/541,815, Axel Gerlt et al.
U.S. Appl. No. 10/541,956, Wolfgang Clemens et al.
U.S. Appl. No. 10/541,957, Walter Fix et al.
U.S. Appl. No. 10/543,561, Wolfgang Clemens et al.
U.S. Appl. No. 10/542,678, Adolf Bernds et al.
U.S. Appl. No. 10/542,679, Adolf Bernds et al.
Assadi A, et al:, Field-Effect Mobility of Poly (3-Hexylthiophene) Dept. of Physics and Measurement Technology, Received Mar. 3, 1988; accepted for Publication May 17, 1988.
Bao, Z. et al., "High-Performance Plastic Transistors Fabricated by Printing Techniques", Chem. Mater vol. 9, No. 6, 1997, pp. 1299-1301.
Brabec, C.J. et al, "Photoinduced FT-IR spectroscopy and CW-photocurrent measurements of conujugated polymers and fullerenes blended into a conventional polymer matrix", Solar Energy Materials and Solar Cells, 2000 Elsevier Science V.V., pp. 19-33.
Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.
Braun D., et al, "Visible light emission from semiconducting polymer diodes", American Institute of Physics, Applied Physics Letters 58, May 6, 1991, pp. 1982-1984.
Brown, A.R. et al., "Field-effect transistors made from solution-processed organic semiconductors", Elsevier Science, S.A., Synthetic Metals 88 (1997) pp. 37-55.
Brown, A.R., "Logic Gates Made from Polymer Transistors and Their Use in Ring Oscillators", Science, vol. 270, Nov. 10, 1995, pp. 972-974.
Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.
Chen, X.L. et al., "Morphological and Transistor Studies of Organic Molecular Semiconductors with Anisotropic Electrical Characteristics", American Chemical Society, 2001, Chem. Mater. 2001, 13, 1341-1348.
Clemens, W. et al., "Vom Organischen Transistor Zum Plastik-Chip," Physik Journal, V. 2, 2003, pp. 31-36.
Collet J. et al:, Low Voltage, 30 nm Channel Length, Organic Transistors With a Self-Assembled Monolayer as Gate Insulating Films:, Applied-Physics Letters, American Institute of Physics, New York, US, Bd 76, Nr. 14, Apr. 3, 2000, Seiten 1941-1943, XP000950589, ISSN:0003-6951, das ganze Dokument.
Crone, B. et al., "Large-scale complementary Integrated circuits based on Organic transistors", Nature, vol. 403, Feb. 3, 2000, pp. 521-.
Dai, L. et al., Photochemical Generation of Conducting Pattersn in Polybutadiene Films:, Macromolecules, vol. 29, No. 1, 1996, pp. 282-287, XP 001042019, the whole document.
Dai, L. et al., "$I_2$-Doping" of 1,4-Polydienes, Elsevier Science S.A., Synthetic Metals 69 (1995), pp. 563-566.
Dai, L. et al., "Conjugation of Polydienes by Oxidants Other Than Iodine", Elsevier Science S.A., Synthetic Metals 86 (1997) 1893-1894.
De Leeuw D.M. et al., "Polymeric Integrated circuits and light-emitting diodes", Electron Devices Meeting, 1997. Technical Digest, International, Washington, DC, USA Dec. 7-10, 1997, New York, NY, USA, IEEE, US Dec. 7, 1997.
Dodabalapur, A. et al., Organic smart pixels, American Institute of Physics, Applied Physics Letters, vol. 73, No. 2, Jul. 13, 1998, pp. 142-144.
Ficker, J. et al., "Dynamic and Lifetime Measurements of Polymer OFETS and Integrated Plastic Circuits," Proc. of SPIE, v. 466, 2001, pp. 95-102.
Fix, W. et al., "Fast Polymer Integrated Circuits Based on a Polyfluorene Derivative", ESSDERC 2002, 2002, pp. 527-529.
Fix, W., et al., "Fast polymer integrated circuits", American Institute of Physics, Applied Physics Letters, vol. 81, No. 89, Aug. 2002, pp. 1735-1737.
Fraunhofer Magazin- Polytronic Chips Von der Rolle, 4.2001, pp. 8-13.
Garnier F et al:, "Vertical Devices Architecture By Molding Of Organic-Based Thin Film Transistor", Applied Physics Letters, American Institute Of Physics. XP000784120, issn: 0003-6951 abbildung 2.
Garnier et al., "Conjugated Polymers and Oligomers as Active Material For Electronic Devices", Synthetic Metals, vol. 28, 1989.
Gelinck, G.H. et al., "High-Performance All-Polymer Integrated Circuits", Applied Physics Letters, v. 77, 2000, pp. 1487-1489.
Gosain, D.P., "Excimer laser crystallized poly-Si TFT's on plastic substrates", Second International Symposium on Laser Precision Microfabrication, May 16-18, 2001, Singapore, vol. 4426, pp. 394-400.
Halls, J.J. M., et al., "Efficient photodiodes from interpenetrating polymer networks", Nature, vol. 376, Aug. 10, 1995, pp. 498-500.
Harsanyi G. et al, "Polytronics for biogtronics:unique possibilities of polymers in biosensors and BioMEMS", IEEE Polytronic 2002 Conference, Jun. 23, 2002, pp. 211-215.
Hebner, T.R. et al., Ink-jet printing of doped polymers for organic light emitting devices:, American Institute of Physics, Applied Physics Letters, vol. 72, No. 5, Feb. 2, 1998, pp. 519-521.
Hwang J D et al:, "A Vertical Submicron Sic thin film transistor", Solid State Electronics, Elsevier Science Publishers, Barking, GB, Bd. 38, NR. 2, Feb. 1, 1995, Seiten 275-278, XP004014040, ISSN0038-1101, Abbildung 2.
IBM Technical Disclosure Bulletin, "Short-Channel Field-Effect Transistor", IBM Corp., New York, US, Bd. 32, Nr. 3A, Aug. 1, 1989, Seiten 77-78, XP000049357, ISSN:0018-8689, das ganze Dokument.
Kawase, T. et al., "Inkjet Printed Via-Hole Interconnections and Resistors for All-Polymer Transistor Circuits", Advanced Materials 2001, 13, No. 21, Nov. 2, 2001, pp. 1601-1605.

Klauk, H. et al., "Fast Organic Thin Film Transistor Circuits", IEEE Electron Device Letters, vol. 20, No. 6, pp. 289-291.

Klauk, H. et al., "Pentacene Thin Film Transistors and Inverter Circuits", 1997 International Exectron Devices Meeting Technical Digest, pp. 539-542, Dec. 1997.

Knobloch, A. et al., "Printed Polymer Transistors", Proc. Polytronic, v. 84, 2001, pp. 84-89.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Koezuka, H. et al., "Macromolecular Electronic Device", Mol. Cryst. Liq. Cryst. 1994, vol. 2555, pp. 221-230.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Lidzey, D. G. et al., "Photoprocessed and Micropatterned Conjugated Polymer LEDs", Synthetic Metals, V. 82, 1996, pp. 141-148.

Lowe, J. et al., "Poly (3-(2-Acetoxyethyl)Thiophene): A Model Polymer for Acid-Catalyzed Lithography", Synthetic Metals, Elsevier Sequoia, Lausanne, CH, Bd, 85, 1997, Seiten 1427-1430.

Lu, Wen et al., "Use of Ionic Liquids for $\pi$-Conjugated Polymer Electrochemical Devices", Science, vol. 297, 2002, pp. 983-987.

Lucent Technologies, "Innovation marks significant milestone in the development of electronic paper", Cambridge, MA and Murray Hill, NJ, Nov. 20, 2000. XP-002209726.

Manuelli, Alessandro et al., "Applicability of Coating Techniques for the Production of Organic Field Effect Transistors", IEEE Polytronic 2002 Conference, 2002, pp. 201-204.

Miyamoto, Shoichi et al:, Effect of LDD Structure and Channel Poly-Si Thinning on a Gate-All-Around TFT (GAT) for SRAM's, IEEE Transactions on Electron Devices, vol. 46, No. 8, Aug. 1999.

Oelkrug, D. et al., "Electronic spectra of self-organized oligothiophene films with 'standing' and 'lying' molecular units", Elsevier Science S.A., 1996, Thin Solid Films 284-270.

Qiao, X. et al., "The FeCl3-doped poly3-alkithiophenes) in solid state", Elsevier Science, Synthetic Metals 122 (2001) pp. 449-454.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics, New York, US, Bd. 75, Nr. 7, Aug. 16, 1999, Seiten 1010-1012, XP000934355, ISSN: 003-6951, das ganze Dokument.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Roman et al., Polymers Diodes With High Rectification:, Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al., "Ultra-thin Organic Films for Field Effect Transistors", SPIE vol. 4466, 2001, pp. 35-43.

Schoebel, "Frequence Conversion with Organic-On-Inorganic Heterostructured Diodes", Extended Abstracts of the International Conference on Solid State Devices and Materials, Sep. 1, 1997.

Schrodner M. et al., "Plastic electronics based on Semiconducting Polymers", First International IEEE Conference on Polymers and Adhesives in Microelectronics and Photonics. Incorporation Poly, Pep & Adhesives in Electronics. Proceedings (Cat No. 01TH8592), First International IEEE Conference on Polymers and Adhesives in Micr, Seitenn 91-94.

Shaheen, S.E., et al., "Low band-gap polymeric photovoltaic devices", Synthetic Metals, vol. 121, 2001, pp. 1583-1584.

Takashima, W. et al., Electroplasticity Memory Devices Using Conducting Polymers and Solid Polymer Electrolytes, Polymer International Melbourne, 1992, pp. 249-253.

Ullman, A. et al., "High Performance Organic Field-Effect Transistors and Integrated Inverters", Mat. Res. Soc. Symp. Proc., v. 665, 2001, pp. 265-270.

Velu, G. et al. "Low Driving Voltages and Memory Effect in Organic Thin-film Transistors With A Ferroelectric Gate Insulator", Applied Physics Letters, American Institute of Physics, New York, Vo.l 79, No. 5, 2001, pp. 659-661.

Wang, Yading et al., "Electrically Conductive Semiinterpenetrating Polymer Networks on Poly(3-actylthiophene)", Macromolecules 1992, vol. 25, pp. 3284-3290.

Yu, G. et al., "Dual-function semiconducting polymer devices: Light-emitting and photodetecting diodes"; American Institute of Physics, Applied Physics Letter 64, Mar. 21, 1994, pp. 1540-1542.

Zheng, Xiang-Yang et al., "Electrochemical Patterning of the Surface of Insulators with Electrically Conductive Polymers", J. Electrochem. Soc., v. 142, 1995, pp. L226-L227.

* cited by examiner

ORGANIC ELECTRONIC COMPONENT COMPRISING A PATTERNED, SEMI-CONDUCTING FUNCTIONAL LAYER AND A METHOD FOR PRODUCING SAID COMPONENT

The invention relates to an organic electronic component such as an organic field effect transistor and a method for producing said component, the semiconducting layer of the component being patterned.

In the case of organic electronic components, the organic semiconducting functional layers are usually applied in large-area fashion by spin-coating, spraying on, squeegeeing or the like as homogeneous large-area but very thin functional layers.

In an integrated circuit, that may lead to problems since leakage currents arise from one component or from one electrode to the next if the semiconducting functional layers of the components adjoin one another. Said leakage currents disrupt the performance of the circuit in some instances, considerably. Therefore, attempts are made to pattern the semiconducting functional layers and/or to reduce them to the active areas, that is to say the regions where current channels form. This patterning can be achieved by means of corresponding exposure masks in the case of components produced photolithographically. Components produced photolithographically become too expensive, however, for broad application. Therefore, the focus is on inexpensive printing production methods for the development of the elements.

However, the semiconducting functional layer cannot be applied in patterned fashion by conventional printing method because this layer must be very thin (typically less than 100 nm) in order for it to function. The layer thicknesses required for the semiconducting functional layer, for example, can conventionally be achieved only by means of a coating process such as coating, spraying on, etc.

It is an object of the present invention to make it possible, in the case of organic electronic components produced in printed fashion, to pattern a thin, in particular the semiconducting functional layer without in this case increasing the layer thickness of the affected functional layer in comparison with a, e.g. semiconducting, functional layer normally produced by a coating process (coating, spraying on, squeegeeing).

The, invention relates to an organic electronic component comprising a patterned semiconducting functional layer having a thickness of less than 100 nm, the patterning arising by virtue of a lower functional layer being only partially wetted with the organic functional material of the next functional layer. The invention additionally relates to a method for producing an organic electronic component, in which, through targeted treatment of a lower functional layer, an upper functional layer is produced in patterned fashion despite large-area application.

According to one embodiment of the method, a semiconducting layer is produced in patterned fashion.

According to one exemplary embodiment, the lower functional layer is partially covered by a resist that can be applied with a very small layer thickness by printing.

Semiconducting, insulating, and/or conductive organic functional layers, but of course also inorganic functional layers, such as e.g. thin metal layers, can be produced in patterned fashion by the method as upper, patterned functional layers.

Depending on the construction of the organic electronic component and the upper layer, the lower functional layer is the substrate, a conductive functional layer, etc.

The term "targeted treatment" denotes the partial coverage and/or the local alteration of the lower functional layer, which has the effect that, in selected regions of the lower functional layer, in the course, of coating with the material, wetting takes place or is avoided (that is to say "partial wetting" takes place), and can be effected by means of a printing method, by laser treatment, thermal treatment, other physical, electrical or chemical treatment, but always partially and with a resolution in the μm range. By way of example, mention shall be made of partial contact-making with acid/base or ocher reactive chemical substances, physical effects such as light, heat, cold, and finally mechanical treatment such as rubbing. The treatment has the consequence in any event that tie next functional layer does not undergo wetting on the treated locations or undergoes wetting only there.

The term "organic material" and/or "functional polymer" here encompasses all types of organic, organometallic and/o inorganic plastics. It concerns all types of substances with the exception of the semiconductors that form the traditional diodes (germanium, silicon) and the typical metallic conductors. Accordingly, a restriction in the dogmatic sense to organic material as material containing carbon is not envisaged, rather the broad use of e.g. silicones is also conceived of. Furthermore, the term is not intended to be subject to any restriction with regard to the molecular size, in particular to polymeric and/or oligomeric materials, rather the use of "small molecules" is also entirely possible.

The invention will be explained below with reference to two figures showing a plan view and a cross section through an exemplary embodiment of an organic electronic component according to the invention:

FIG. 1 shows a plan view of a circuit having a patterned semiconducting functional layer. An organic circuit constructed on a substrate (concealed) can be seen. A plurality of active elements such as organic field effect transistors are arranged one beside the other; the source/drain electrodes 2 can be discerned in each case. The hatched region shows the organic semiconductor layer 1, which is patterned and has partial regions 3 which are free of semiconducting functional material. The free region 3 ("free" in this case means covered neither with conductive nor with semiconducting material) suppresses a leakage current from the left-hand region into the right-hand region of the circuit.

Figure 2:
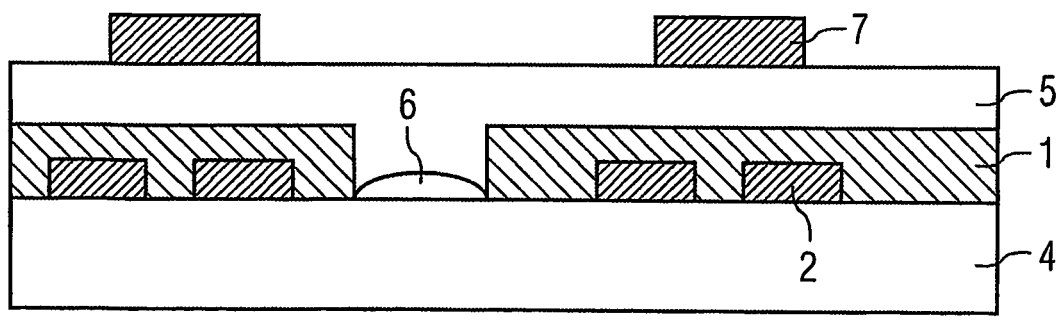

FIG. 2 shows an OFET having the substrate 4 and the source/drain electrodes 2. Situated on the conductive functional layer, the source/drain electrodes 2, is the patterned semiconducting functional layer 1, which does not extend over the conductive functional layer 2 in whole-area fashion, but rather is interrupted by the resist 6, which partially covers the substrate 4 against wetting with semiconducting functional layer 1, in other words said semiconducting functional layer covers in patterned fashion only the active areas, that is to say the areas above the source/drain electrodes. The semiconducting functional layer for its part is covered by the insulating functional layer 5, on which the gate electrodes 7 are situated.

The invention relates to an organic electronic component such as an organic field effect transistor and a method for producing said component, a thin layer, such as the semiconducting layer of the component being patterned, although the component can be produced by an inexpensive printing method. In order to achieve this, the lower functional layer is prepared by a treatment such that it has partial regions on which betting takes place in the subsequent process step, and partial regions on which wetting is not effected.

The invention claimed is:

1. An organic electronic component comprising:
   a substrate;
   a patterned electrically conductive electrode lower layer on and contiguous with a surface of the substrate, the lower layer being formed as a plurality of spaced apart sets of electrodes wherein each set comprises spaced apart source/drain electrodes;
   an arrangement on and contiguous with a region of the substrate located between at least two of the sets of said electrodes, the arrangement for precluding the wetting of that substrate region by a subsequently applied organic functional semiconducting layer and to thereby minimize current leakage between the two sets of electrodes; and
   a patterned functional organic semiconductor layer on, over and contiguous with the at least two sets of electrodes and on, over, and contiguous with the substrate surrounding the at least two sets of the electrodes to thereby embed the at least two sets of electrodes in the semiconductor layer wherein there is substantially no semiconductor layer overlying or contiguous with the substrate in said region of the substrate.

2. The organic electronic component as claimed in claim 1, further including an electrically insulating layer over the semiconductor layer and the region and a gate electrode over each set of said drain/source electrodes.

3. An organic electronic component comprising:
   a substrate;
   a lower layer forming a set of spaced apart drain/source electrodes defining a first area of a given peripheral extent on and contiguous with the substrate
   a second area of the substrate external the given peripheral extent defining a given substrate region;
   an arrangement on the given substrate region for precluding the welling of that given substrate region by a subsequently applied organic functional semiconducting layer;
   the arrangement for forming the semiconductor layer into a patterned functional organic semiconductor layer on and contiguous with the substrate in a portion thereof between the second area and the electrodes and overlying and contiguous with the electrodes to thereby embed the electrodes in the semiconductor layer, the second area of the substrate being non-wetted by the semiconductor layer and thereby free of the semiconductor layer;
   an electrically insulating layer over and contiguous with at least the semiconductor layer;
   an electrically conductive gate electrode over and contiguous with the insulating layer to thereby form a first field effect transistor (FET) with the semiconductor layer and the insulating layer; and
   a further FET on and contiguous with the substrate and spaced from the first FET by said region to thereby minimize leakage currents across said region between said first and further FETs.

4. An organic component according to claim 3, including a plurality of said FET transistors on said substrate and electrically conductively interconnected to form a circuit and wherein each said FET is spaced from an adjacent FET by a region which exhibits said minimized leakage currents.

5. The electronic organic component according to claim 1 further including an electrically insulating layer over the semiconductor layer and the region and a gate electrode over each set of said drain/source electrodes wherein a set of electrodes, the semiconductor layer and a gate electrode each form an organic field effect transistor (FET) on the substrate to thereby form a plurality of FET transistors, and further including at least one conductor for electrically coupling the plurality of FET transistors into a common circuit and wherein the region exhibits negligible current leakage from and to the FET transistors in the circuit.

6. A method for producing an organic electronic component comprising:
   forming a substrate;
   forming a lower layer on and contiguous with the substrate as a set of spaced apart drain/source electrodes defining a first area of a given peripheral extent;
   forming a second area of the substrate external the given peripheral extent defining a given substrate region;
   forming an arrangement on the given substrate region for precluding the wetting of that given substrate region by a subsequently applied organic functional semiconducting layer;
   causing the arrangement to form the semiconductor layer into a patterned functional organic semiconductor layer on and contiguous with the substrate in a portion thereof between the second area and the electrodes and overlying and contiguous with the electrodes to thereby embedded the electrodes in the semiconductor layer, the second area of the substrate being non-wetted by the semiconductor layer and thereby free of the semiconductor layer;
   applying an electrically insulating layer over and contiguous with at least the semiconductor layer;
   forming an electrically conductive gate electrode over and contiguous with the insulating layer to thereby form a first field effect transistor (FET) with the semiconductor layer and the insulating layer; and
   forming a further FET on and contiguous with the substrate and having drain/source electrodes spaced from the drain/source first FET by said region wherein said region thereby minimizes leakage currents there across between said first and further FETs 7. The method of claim 6, wherein the forming the arrangement includes printing a resist layer on the given substrate region.

8. The method of claim 6, wherein the forming the arrangement comprises printing a treatment on the given substrate region.

9. A circuit formed of organic field effect (FET) transistors comprising organic functional layers, the circuit comprising:
   a substrate; and
   a plurality of adjacent organic FETs on and contiguous with a surface of the substrate, each FET comprising one or more electrically conductive functional layer electrodes forming a drain and a source electrode for each FET on and contiguous with the substrate and a patterned organic semiconducting layer on and contiguous with the one or more of the drain/source electrodes and on and contiguous with a portion of the substrate surface about the drain/source electrodes;
   an arrangement on and contiguous with the substrate surface between each of the drain/source electrodes of the next adjacent FETs for precluding the wetting of the substrate by the semiconducting layer to thereby form the pattern of the semiconductor layer on the substrate with the region of the arrangement being free of the semiconductor layer;

the patterned semiconducting functional layer having an electrical interruption between next adjacent components formed by the arrangement precluding the wetting of the substrate by the semiconductor layer, the interruption for minimizing current leakage between the drain/source electrodes of the next adjacent FETs.

10. The circuit of claim 9, wherein the electrical interruption comprises a semiconducting free area on the substrate.

11. The circuit of claim 9, wherein the arrangement includes a resist on the substrate.

12. The circuit of claim 9, wherein the arrangement includes a surface treatment applied to the substrate in the free area for said preventing.

* * * * *